(12) United States Patent
Park

(10) Patent No.: US 6,995,063 B2
(45) Date of Patent: Feb. 7, 2006

(54) METHOD OF FABRICATING MEMORY CELL IN SEMICONDUCTOR DEVICE

(75) Inventor: Tae Hee Park, Kyunggido (KR)

(73) Assignee: DongbuAnam Semiconductor, Inc., Seoul (KR)

(*) Notice: Subject to any disclaimer, the term of this patent is extended or adjusted under 35 U.S.C. 154(b) by 0 days.

(21) Appl. No.: 11/024,673

(22) Filed: Dec. 30, 2004

(65) Prior Publication Data

US 2005/0189581 A1    Sep. 1, 2005

(30) Foreign Application Priority Data

Dec. 30, 2003    (KR) ...................... 10-2003-0100555

(51) Int. Cl.
*H01L 21/336*    (2006.01)
(52) U.S. Cl. ...................... 438/257; 438/263; 438/264
(58) Field of Classification Search ................ 438/257, 438/263, 264
See application file for complete search history.

(56) References Cited

U.S. PATENT DOCUMENTS 6,518,110 B2 * 2/2003 Wen ........................... 438/201
6,903,405 B2 * 6/2005 Takahashi ................... 257/314
2002/0052079 A1 * 5/2002 Wen ........................... 438/257

\* cited by examiner

*Primary Examiner*—Trung Dang

(74) *Attorney, Agent, or Firm*—Oblon, Spivak, McClelland, Maier & Neustadt, P.C.

(57) ABSTRACT

A method of fabricating a memory cell in a semiconductor device, by which a data storage function is dichotomized in a manner of controlling a quantity of electrons injected in each floating gate according to drain and control gate voltages applied thereto. The method includes the steps of defining source, first floating gate, control gate, second floating gate, and drain areas on a substrate to have the control gate area lie between the first and second floating gate areas, forming source and drain regions on the source and drain areas of the substrate, respectively, forming a gate oxide layer on the semiconductor substrate, and reducing the gate oxide layer on the first and second floating gate areas in thickness. The method also includes forming first and second floating gates on the reduced gate oxide layer in the first and second gate areas, respectively, forming an ONO layer on top sides and confronting sidewalls of the first and second floating gates, and forming a control gate on the ONO layer and the gate oxide layer on the control gate area to be overlapped with the first and second floating gates.

10 Claims, 7 Drawing Sheets

METHOD OF FABRICATING MEMORY CELL IN SEMICONDUCTOR DEVICE

BACKGROUND OF THE INVENTION

1. Field of the Invention

The present invention relates to a method of fabricating a memory cell in a semiconductor device, and more particularly, to a method of fabricating a memory cell having a dual floating gate in a semiconductor device.

2. Discussion of the Related Art

FIG. 1 is a cross-sectional diagram of the Flasys memory cell according to a related art.

Referring to FIG. 1, a floating gate 2, an oxide-nitride-oxide (ONO) layer 7, and a control gate 1 are stacked on a substrate 5.

And, a poly-metal dielectric 6 is formed on the substrate 5 including the floating gate 2, the ONO layer 7, and the control gate 1.

An operational principle of the related art memory cell is explained as follows.

First of all, in order to store data, capacitance coupling occurs in the ONO layer 7 by a positive voltage applied to the control gate 1 to bring about a turned-on state so that electrons can be sucked into the floating gate 2 by a current between a source 3 and a drain 4.

In order to erase data, a negative voltage is applied to the control gate 1 and a positive voltage is applied to the substrate 5, whereby the electrons stored in the floating gate 2 are drained out to the substrate 5.

Such a data storing/erasing method is called a single type method.

However, the single type method stores/erases data in/from the single gate 2 only, thereby putting a limitation on memory capacity unless a critical dimension of the device is increasingly lowered for higher degree of integration.

And, it is impossible to enable dichotomization on storing data.

SUMMARY OF THE INVENTION

Accordingly, the present invention is directed to a method of fabricating a memory cell in a semiconductor device that substantially obviates one or more problems due to limitations and disadvantages of the related art.

The present invention advantageously provides a method of fabricating a memory cell in a semiconductor device, in which a dual floating gate is differentiated from a control gate in gate oxide thickness and in which a data storage function is dichotomized by a quantity control of electrons injected in each floating gate according to drain and control gate voltages applied thereto.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a memory cell in a semiconductor device according to the present invention includes the steps of defining a source area, a first floating gate area, a control gate area, a second floating gate area, and a drain area on a substrate to have the control gate area lie between the first and second floating gate areas, and forming source and drain regions on the source and drain areas of the substrate, respectively. The method also includes the steps of forming a gate oxide layer on the semiconductor substrate, reducing the gate oxide layer on the first and second floating gate areas in thickness, and forming first and second floating gates on the reduced gate oxide layer in the first and second gate areas, respectively. The method further includes the steps of forming an oxide-nitride-oxide layer on topsides and confronting sidewalls of the first and second floating gates, and forming a control gate on the oxide-nitride-oxide layer and the gate oxide layer on the control gate area to be overlapped with the first and second floating gates.

Preferably, in the gate oxide layer reducing step, the gate oxide layer on the first and second floating gate areas is etched to be thinner than the gate oxide layer on the control gate area.

More preferably, the gate oxide layer is anisotropically etched using an etch mask provided to cover the gate oxide layer on the control gate area.

Preferably, the method further includes the step of forming impurity layers in the substrate of the source and drain areas, respectively.

Preferably, the substrate is a semiconductor substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First of all, the present invention is applicable to a method of fabricating the Flasys memory cell, and more particularly, to a method of fabricating a cell operative in memory function using a pair of cell electrodes.

FIGS. 2A to 2K are cross-sectional diagrams for explaining a method of fabricating a memory cell having a dual floating gate in a semiconductor device according to the present invention.

Figure 1:
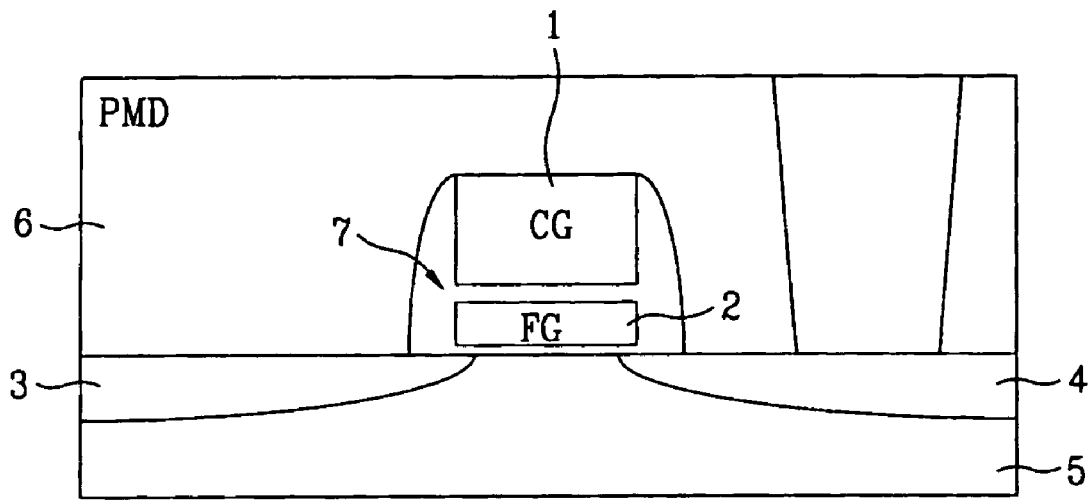
FIG. 1 is a cross-sectional diagram of the Flasys memory cell according to a related art.
Figure 2A:
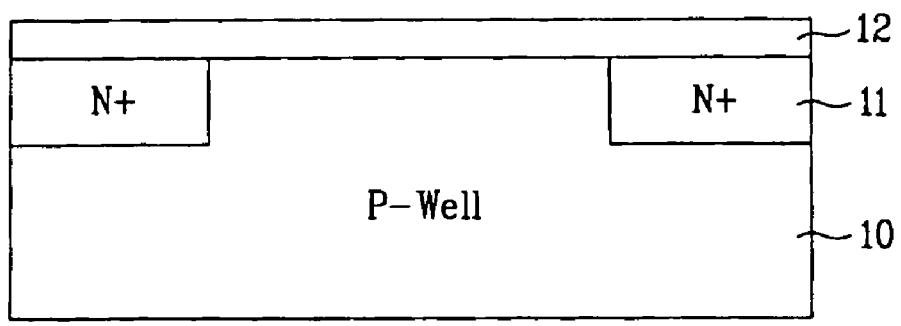
FIGS. 2A to 2K are cross-sectional diagrams for explaining a method of fabricating a memory cell having a dual floating gate in a semiconductor device according to the present invention.

Referring to FIG. 2A, impurity buried layers (N+) 11 are formed on regions for forming a source and a drain in a p-well of a silicon substrate 10 except areas for forming gates thereon.

And, a gate oxide layer 12 is formed on the substrate 10 including the impurity buried layers (N+) 11. In doing so, it is assumed that the gate oxide layer 12 is formed about 200 Å thick by taking a control gate as a reference since a thickness of the gate oxide layer 12 depends on the control or floating gate that will be explained later.

Figure 2B:
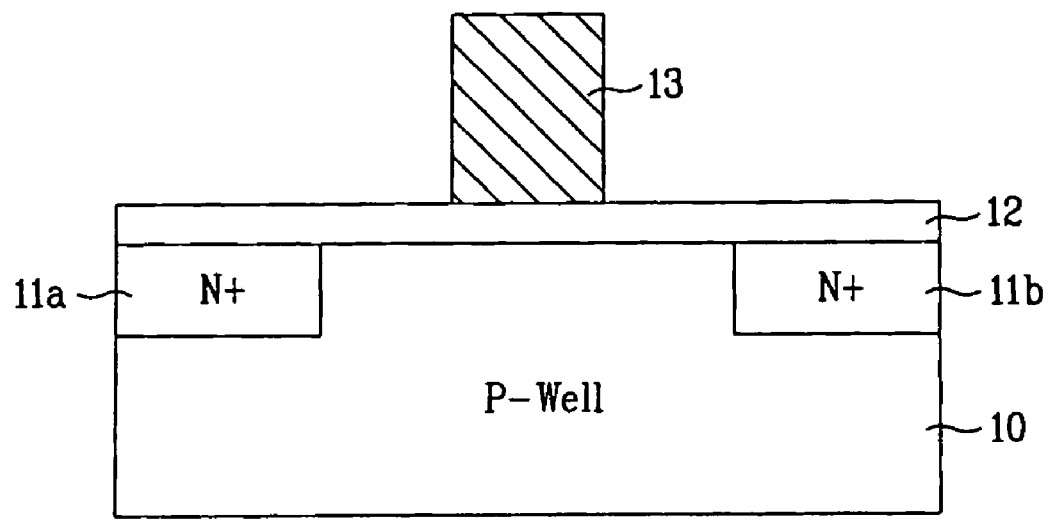

Referring to FIG. 2B, a mask pattern 13 defining the area for forming a control gate is formed on the gate oxide layer 12. In this case, the mask pattern 13 is formed using a photoresist pattern.

Figure 2C:
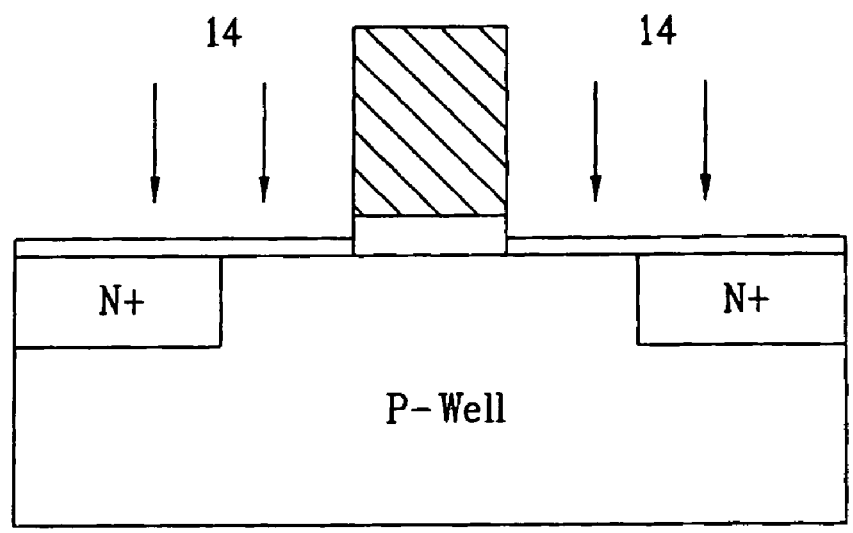

Referring to FIG. 2C, a dry etch is carried out on the gate oxide layer failing to be covered with the mask pattern 13 and is then stopped if about 100 Å of the thickness of the gate oxide layer remains.

Figure 2D:
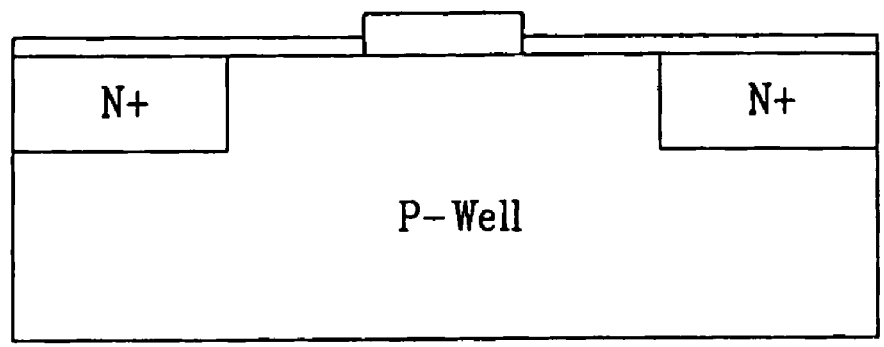

Referring to FIG. 2D, the mask (photoresist) pattern 13 is removed from the substrate by stripping or ashing, whereby an intact portion of the gate oxide layer beneath the mask pattern is exposed.

Figure 2E:
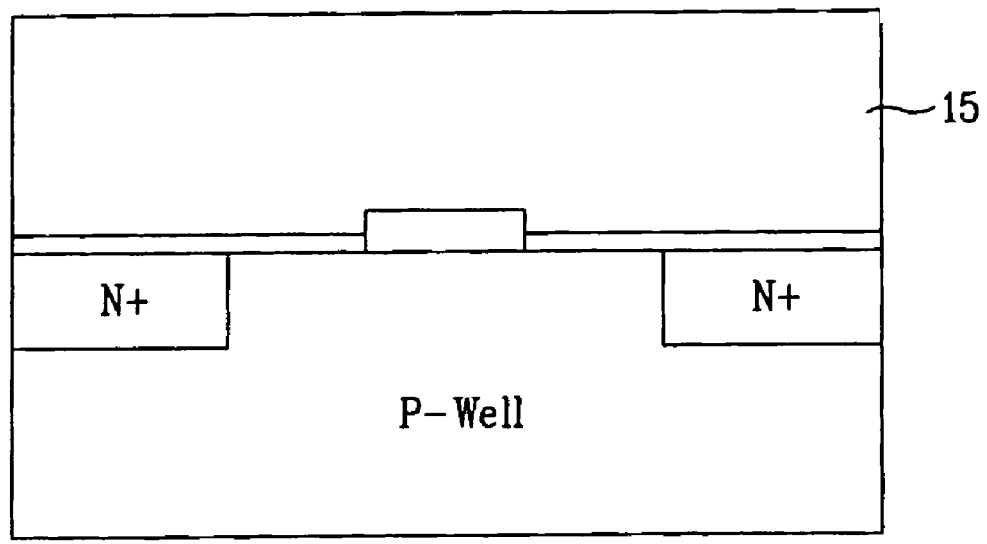

Referring to FIG. 2E, a first polysilicon layer 15 for forming a floating gate is deposited over the substrate.

In this case, polysilicon is used for the first polysilicon layer 15 as a conductive layer. Optionally, various kinds of conductive materials are applicable to the conductive layer.

Figure 2F:
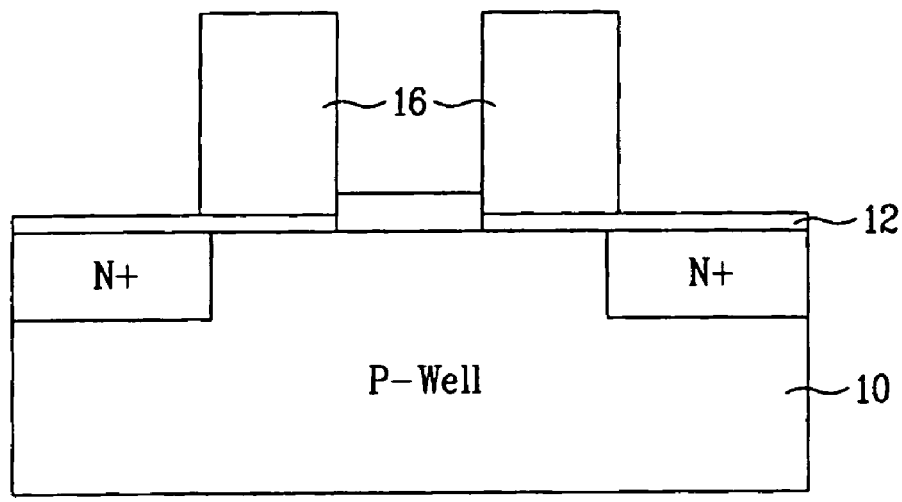

Referring to FIG. 2F, an etch pattern (not shown in the drawing) defining a dual floating gate is formed on the first polysilicon layer 15.

Anisotropic etch is carried out on the first polysilicon layer 15 failing to be covered with the etch pattern until the gate oxide layer is exposed, whereby portions of the first polysilicon layer remain to form the dual floating gates 16, respectively. In doing so, a space is reserved between the dual floating gates 16 for the area for forming a control gate thereon.

The etch pattern is then removed from the substrate.

Figure 2G:
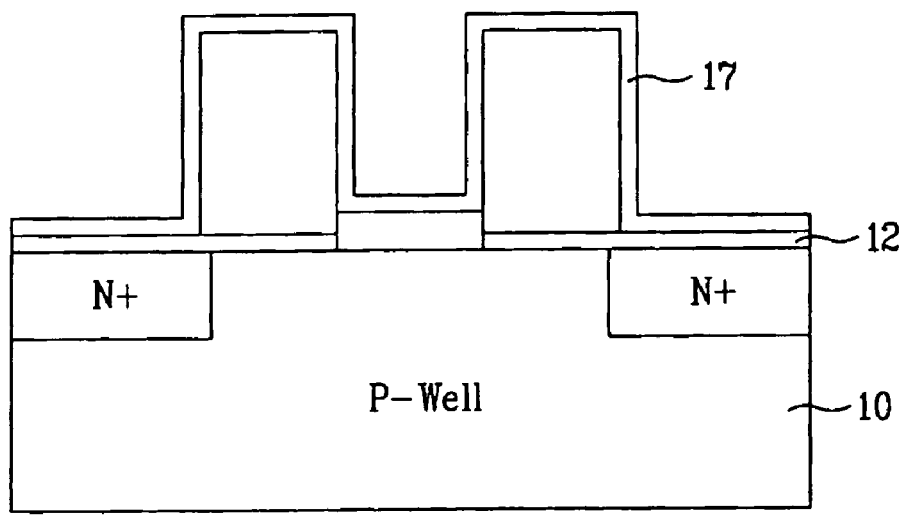

Referring to FIG. 2G, an oxide-nitride-oxide (ONO) layer 17 is stacked over the substrate including the dual floating gate 16. In doing so, the ONO layer 17 is formed in a manner of depositing oxide by about 30 Å, nitride by about 50 Å, and oxide by about 20 Å in turn.

Figure 2H:
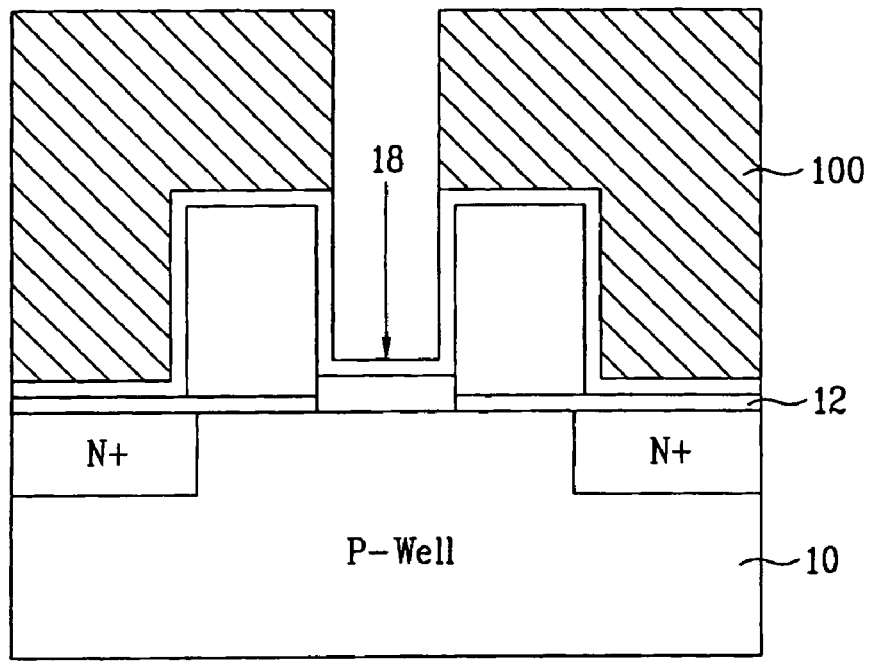

Referring to FIG. 2H, a portion of the ONO layer 17 corresponding to the control gate forming area between the dual floating gates 16 is removed by an etch 18 only. In doing so, the etch is carried out using a photoresist pattern 100 exposing the portion of the ONO layer on the control gate forming area.

Figure 2I:
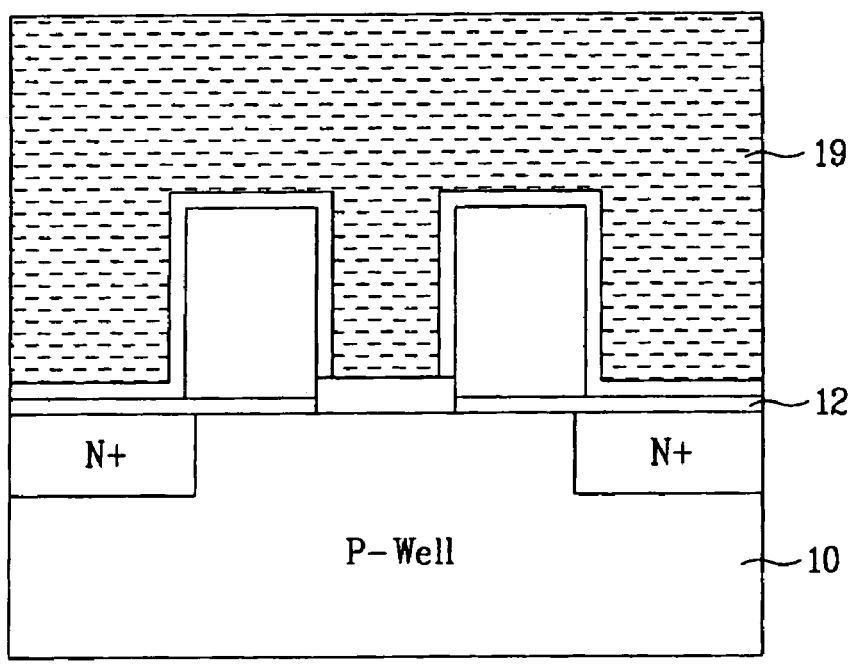

Referring to FIG. 2I, after the photoresist pattern 100 in FIG. 2H has been removed, a second polysilicon layer 19 is deposited over the substrate including the exposed gate oxide layer. In this case, polysilicon is used for the second polysilicon layer 19 as a conductive layer. Optionally, various kinds of conductive materials are applicable to the conductive layer.

Figure 2J:
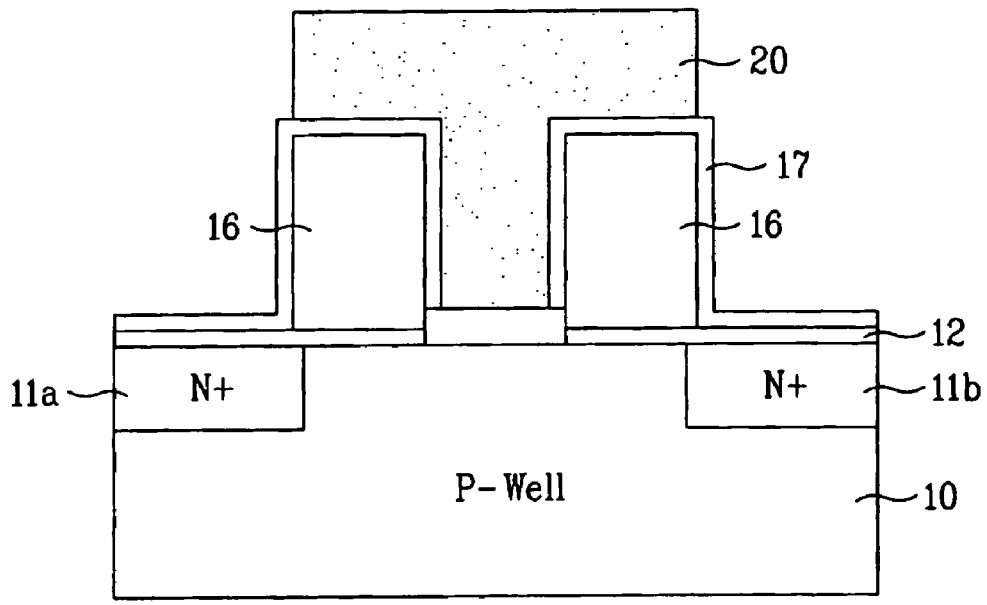

Referring to FIG. 2J, a control gate pattern defining a control gate is formed on the second polysilicon layer 19. And, anisotropic etch is carried out on the second polysilicon layer to form the control gate 20 using the control gate pattern as an etch mask.

The control gate pattern is then removed.

Figure 2K:
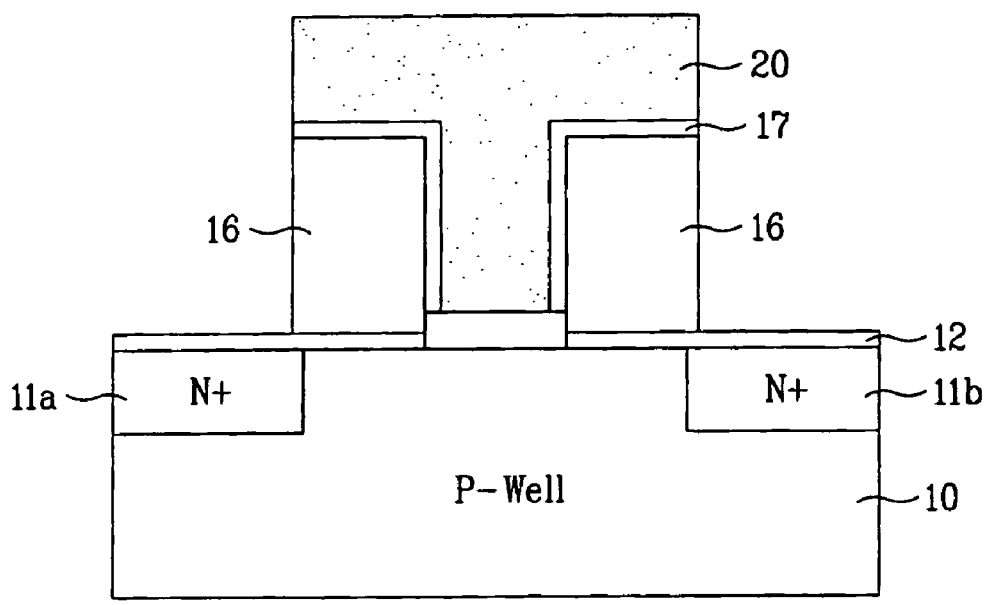

Referring to FIG. 2K, a portion the ONO layer failing to be inserted between (i.e. the portion of the ONO layer that is not in between) the control gate 20 and the dual floating gate 16 is removed to complete a final gate structure.

In doing so, since the gate oxide layer 12 beneath the removed ONO layer is formed of oxide as well, a thickness control should be carefully performed on etching the ONO layer.

Specifically, considering the loss occurring in etching the ONO layer in the step shown in FIG. 2K, the thickness of the gate oxide layer 12 in FIG. 2C is set to about 100 Å. Hence, a final thickness of the gate oxide layer 12 becomes about 50 to about 70 Å after completion of etching the ONO layer.

Meanwhile, an operational principle of the semiconductor memory cell employing a pair of the cell electrodes according to the present invention is explained with reference to FIG. 3 as follows.

Figure 3:
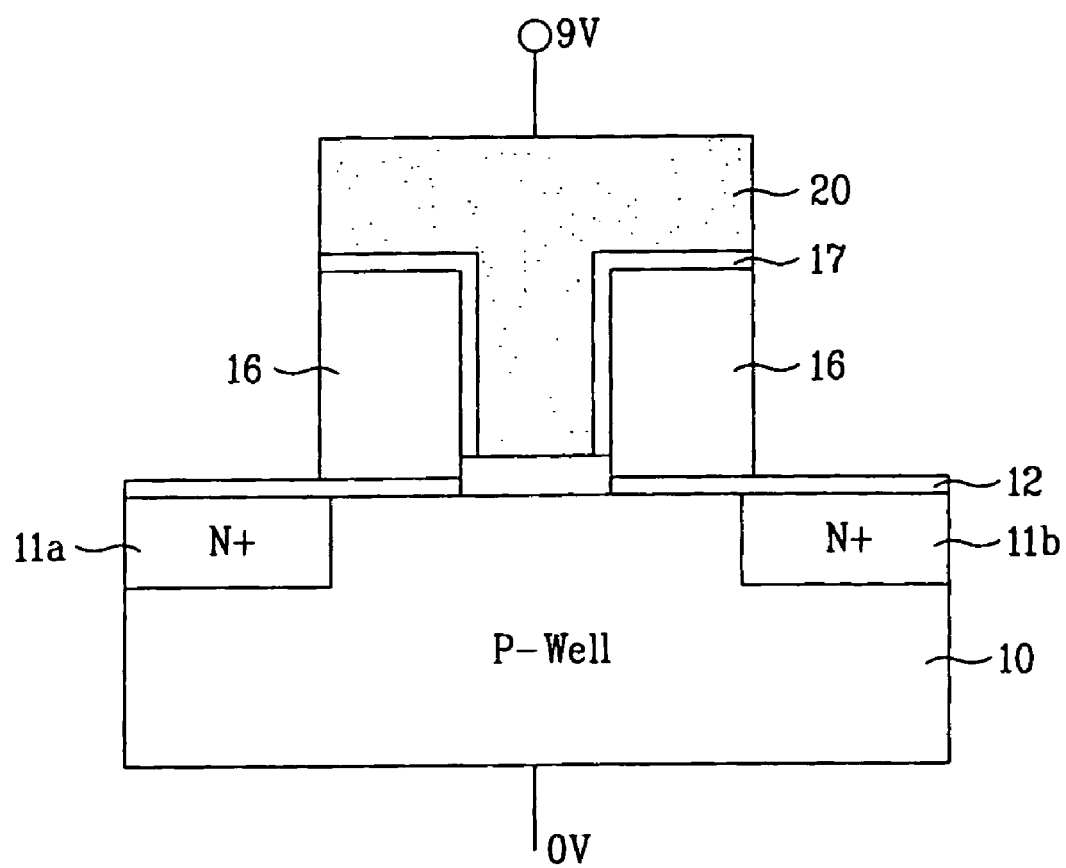
FIG. 3 is a cross-sectional diagram of a memory cell having a dual floating gate in a semiconductor device according to the present invention.

FIG. 3 is a cross-sectional diagram of a memory cell having a dual floating gate in a semiconductor device according to the present invention.

Referring to FIG. 3, in case of storing data, when a positive voltage (for example, 9V as shown in FIG. 3) and 0V are applied to a control gate 20 and a silicon substrate 10, respectively, capacitance coupling occurs to apply a voltage to a floating gate 16 from the control gate 20 via an ONO layer 17. The voltage applied to the floating gate 16 forms a channel between a source 11a and drain 11b, whereby electrons can be accelerated by a voltage in the vicinity of the drain 11b.

The accelerated electrons collide with a lattice to generate election-hole pairs so that the generated holes can form a current within the silicon substrate 10.

Hence, the electrons are injected in the floating gate 16 by the gate voltage to store data.

In doing so, the electrons pass through a thin gate oxide layer of about 50 to about 70 Å thickness on the silicon substrate 10 only via tunneling, whereas tunneling fails to occur through the relatively thick gate oxide layer 12 of about 200 Å thickness beneath the control gate 20. Hence, the electrons are not injected into the control gate 20 since a threshold voltage for turning on the control gate 20 fails to be overcome.

Meanwhile, the electrons dichotomize to be injected into a pair of the floating gates 16, respectively.

In doing so, as the electrons are attracted to the drain 11b from the source 11a according to a size of the voltage applied to the drain 11b, a quantity of the electrons injected into a left floating gate differs from that of the electrons injected into a right floating gate, whereby a data storage function can be dichotomized.

Moreover, if a control gate voltage enough to turn on the threshold voltage of the control gate is applied, the control gate 20 works as one gate to play a role as a cell.

Therefore, by varying the voltage applied to the drain 11b and the voltage applied to the control gate 20, it is able to dichotomize the data storage function.

Accordingly, in the present invention, the dual floating gate is formed and the dual floating gate is differentiated from the control gate in the gate oxide thickness, whereby the data storage function is dichotomized by a quantity control of electrons injected in each floating gate according to drain and control gate voltages applied thereto. Therefore, the present invention expands the data storage capacity to increase memory capacity and to provide various usages of the memory.

Korean Application No. P2003-0100555 filed on Dec. 30, 2003, is hereby incorporated by reference in its entirety.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a memory cell in a semiconductor device, comprising the steps of:
    defining a source area, a first floating gate area, a control gate area, a second floating gate area, and a drain area on a substrate to have the control gate area lie between the first and second floating gate areas;
    forming source and drain regions on the source and drain areas of the substrate, respectively;
    forming a gate oxide layer on the semiconductor substrate;
    reducing the gate oxide layer on the first and second floating gate areas in thickness;
    forming first and second floating gates on the reduced gate oxide layer in the first and second gate areas, respectively;
    forming an oxide-nitride-oxide layer on top sides and confronting sidewalls of the first and second floating gates; and
    forming a control gate on the oxide-nitride-oxide layer and the gate oxide layer on the control gate area to be overlapped with the first and second floating gates.

2. The method of claim 1, wherein, in the gate oxide layer reducing step, the gate oxide layer on the first and second floating gate areas is etched to be thinner than the gate oxide layer on the control gate area.

3. The method of claim 2, wherein the gate oxide layer is anisotropically etched using an etch mask provided to cover the gate oxide layer on the control gate area.

4. The method of claim 1, wherein the substrate is a semiconductor substrate.

5. The method of claim 1, further comprising the step of forming impurity layers in the substrate of the source and drain areas, respectively.

6. A method of fabricating a memory cell in a semiconductor device, comprising:
    a step for defining a source area, a first floating gate area, a control gate area, a second floating gate area, and a drain area on a substrate to have the control gate area lie between the first and second floating gate areas;
    a step for forming source and drain regions on the source and drain areas of the substrate, respectively;
    a step for forming a gate oxide layer on the semiconductor substrate;
    a step for reducing the gate oxide layer on the first and second floating gate areas in thickness;
    a step for forming first and second floating gates on the reduced gate oxide layer in the first and second gate areas, respectively;
    a step for forming an oxide-nitride-oxide layer on top sides and confronting sidewalls of the first and second floating gates; and
    a step for forming a control gate on the oxide-nitride-oxide layer and the gate oxide layer on the control gate area to be overlapped with the first and second floating gates.

7. The method of claim 6, wherein, in the step for reducing the gate oxide layer, the gate oxide layer on the first and second floating gate areas is etched to be thinner than the gate oxide layer on the control gate area.

8. The method of claim 7, wherein the gate oxide layer is anisotropically etched using an etch mask provided to cover the gate oxide layer on the control gate area.

9. The method of claim 6, wherein the substrate is a semiconductor substrate.

10. The method of claim 6, further comprising a step for forming impurity layers in the substrate of the source and drain areas, respectively.

* * * * *